United States Patent
Matsugi et al.

(10) Patent No.: US 12,112,993 B2
(45) Date of Patent: Oct. 8, 2024

(54) HEAT RADIATION MEMBER

(71) Applicant: A.L.M.T. Corp., Tokyo (JP)

(72) Inventors: Ryota Matsugi, Osaka (JP); Isao Iwayama, Osaka (JP); Chieko Tanaka, Toyama (JP); Hideaki Morigami, Toyama (JP)

(73) Assignee: A.L.M.T. CORP., Tokyo (JP)

( * ) Notice: Subject to any disclaimer, the term of this patent is extended or adjusted under 35 U.S.C. 154(b) by 649 days.

(21) Appl. No.: 17/289,259

(22) PCT Filed: Aug. 30, 2019

(86) PCT No.: PCT/JP2019/034154
§ 371 (c)(1),
(2) Date: Apr. 28, 2021

(87) PCT Pub. No.: WO2020/090213
PCT Pub. Date: May 7, 2020

(65) Prior Publication Data
US 2021/0398877 A1    Dec. 23, 2021

(30) Foreign Application Priority Data

Oct. 31, 2018    (JP) .................. 2018-206163

(51) Int. Cl.
*H01L 23/373*    (2006.01)
*B23K 1/00*    (2006.01)
*B23K 35/32*    (2006.01)
*B23K 101/40*    (2006.01)
(Continued)

(52) U.S. Cl.
CPC ........ *H01L 23/3732* (2013.01); *B23K 1/0016* (2013.01); *B23K 35/325* (2013.01); *H01L 23/3736* (2013.01); *B23K 2101/40* (2018.08); *B23K 2103/172* (2018.08); *B23K 2103/56* (2018.08)

(58) Field of Classification Search
CPC ............ H01L 23/3732; H01L 23/3736; B23K 1/0016; B23K 35/325
USPC ....................................................... 257/706
See application file for complete search history.

(56) References Cited

U.S. PATENT DOCUMENTS 4,619,563 A * 10/1986 Doting .................. B23B 27/20
76/DIG. 12
5,570,502 A    11/1996 Sawtell et al.
2002/0094455 A1 * 7/2002 Feist .................. G11B 11/10586
(Continued)

FOREIGN PATENT DOCUMENTS

JP          2008-4760 A      1/2008
WO    WO-2003/040420 A1    5/2003
(Continued)

*Primary Examiner* — Ori Nadav
(74) *Attorney, Agent, or Firm* — Faegre Drinker Biddle & Reath LLP (57) ABSTRACT

A heat radiation member excellent in electrical insulation and better in thermal conduction is provided. The heat radiation member includes a substrate composed of a composite material containing diamond and a metallic phase, an insulating plate provided on at least a part of front and rear surfaces of the substrate and composed of an aluminum nitride, and a single bonding layer interposed between the substrate and the insulating plate, the heat radiation member having thermal conductivity not lower than 400 W/m·K.

4 Claims, 2 Drawing Sheets

(51) Int. Cl.
*B23K 103/00* (2006.01)
*B23K 103/16* (2006.01)

(56) References Cited

U.S. PATENT DOCUMENTS

| | | |
|---|---|---|
| 2005/0051891 A1 | 3/2005 | Yoshida et al. |
| 2009/0057705 A1 | 3/2009 | Takashima et al. |
| 2012/0268895 A1* | 10/2012 | Morelle ................ H01L 23/373 |
| | | 29/846 |
| 2017/0145280 A1* | 5/2017 | Morikawa ........... H01L 23/3732 |
| 2019/0297725 A1 | 9/2019 | Iwayama et al. |

FOREIGN PATENT DOCUMENTS

| | | |
|---|---|---|
| WO | WO-2007/074720 A1 | 7/2007 |
| WO | WO-2016/035795 A1 | 3/2016 |
| WO | WO-2018/105297 A1 | 6/2018 |

\* cited by examiner

HEAT RADIATION MEMBER

TECHNICAL FIELD

The present disclosure relates to a heat radiation member. The present application claims priority to Japanese Patent Application No. 2018-206163 filed on Oct. 31, 2018, the entire contents of which are herein incorporated by reference.

BACKGROUND ART

PTL 1 discloses bonding with a silver brazing material, of an insulating material composed of ceramic to a substrate composed of a composite material containing silver and diamond, in a heat radiation member for a semiconductor element ([0032] in the specification). PTL 1 discloses providing a metal layer on a surface of the substrate and using the metal layer as a base for the brazing material ([0034] in the specification).

CITATION LIST

Patent Literature

PTL 1: WO2016/035795

SUMMARY OF INVENTION

A heat radiation member according to the present disclosure includes a substrate composed of a composite material containing diamond and a metallic phase, an insulating plate provided on at least a part of front and rear surfaces of the substrate and composed of aluminum nitride, and a single bonding layer interposed between the substrate and the insulating plate, the heat radiation member having thermal conductivity not lower than 400 W/m·K.

DETAILED DESCRIPTION

Problem to be Solved by the Present Disclosure

A heat radiation member excellent in electrical insulation and better in thermal conduction has been desired.

A composite material containing diamond high in thermal conductivity is high in thermal conductivity (for example, claim 5 of PTL 1). By bonding an insulating plate composed of ceramic to a substrate composed of such a composite material, electrical insulation is also better. By forming a metal layer such as a nickel plated layer on the substrate, firm bonding can be achieved because the brazing material is wetted with the nickel plated layer ([0058] in the specification of PTL 1). In this case, however, a metal layer such as a nickel plated layer in addition to a layer based on the brazing material is interposed between the substrate made of the composite material containing diamond and the ceramic insulating plate. Interposition by a plurality of metal layers including the nickel plated layer increases thermal resistance. Consequently, thermal conductivity of the entire heat radiation member including the substrate and the insulating plate lowers.

Then, an object of the present disclosure is to provide a heat radiation member excellent in electrical insulation and better in thermal conduction.

Advantageous Effect of the Present Disclosure

A heat radiation member according to the present disclosure is excellent in electrical insulation and better in thermal conduction.

SUMMARY OF EMBODIMENTS

Contents of an embodiment of the present disclosure will initially be listed and described.

(1) A heat radiation member according to one embodiment of the present disclosure includes:

a substrate composed of a composite material containing diamond and a metallic phase;

an insulating plate provided on at least a part of front and rear surfaces of the substrate and composed of aluminum nitride; and a single bonding layer interposed between the substrate and the insulating plate, the heat radiation member having thermal conductivity not lower than 400 W/m·K.

The substrate provided in the heat radiation member in the present disclosure is composed of a composite material containing diamond very high in thermal conductivity. The insulating plate provided in the heat radiation member in the present disclosure is composed of aluminum nitride (AlN) high in thermal conductivity among ceramic materials. The heat radiation member in the present disclosure including the substrate and the insulating plate containing such a material high in thermal conductivity is excellent in thermal conduction. AlN is excellent in electrical insulation. Therefore, the heat radiation member in the present disclosure including the insulating plate composed of AlN is excellent also in electrical insulation.

In particular, in the heat radiation member in the present disclosure, a single bonding layer is interposed between the substrate described above and the insulating plate described above. With the single bonding layer, it can be concluded that thermal resistance is lower than in an example where a layer such as a nickel plated layer that causes increase in thermal resistance is interposed between the substrate and the insulating plate, in addition to the layer based on the brazing material described above. Such a heat radiation member as in the present disclosure is better in thermal conduction and has high thermal conductivity not lower than 400 W/m·K.

The heat radiation member in the present disclosure can representatively be manufactured by bonding the substrate and the insulating plate to each other with a brazing material. For the brazing material, a brazing material composed of an alloy based on a main metal element that makes up the metallic phase in the substrate can suitably be employed. In this case, the main metal element that makes up the brazing material is common to the main metal element that makes up the metallic phase in the substrate. Therefore, at the time of bonding, the metal element serving as the base of the brazing material or an additive element readily diffuses into the metallic phase in the substrate. Such diffusion allows a smaller thickness of the bonding layer formed based on the brazing material. With the bonding layer small in thickness, increase in thermal resistance caused by the bonding layer can be suppressed. In particular, by setting a bonding condition to a specific condition which will be described later, diffusion described above can be accelerated and the bonding layer can more readily be smaller in thickness. By setting a bonding condition to a specific condition which will be described later, the brazing material can sufficiently be molten. Therefore, even though a single bonding layer is interposed between the substrate and the insulating plate, the substrate and the insulating plate can be brought into intimate contact with each other. Therefore, an underlying layer (for example, a nickel plated layer) for the brazing material does not have to be provided on the substrate or the insulating plate. Increase in thermal resistance can effectively be suppressed by providing a single bonding layer without providing an underlying layer for the brazing material and decreasing a thickness of the bonding layer.

(2) An exemplary form of the heat radiation member according to the present disclosure may be such that the bonding layer is composed of an alloy containing Ti and a main metal element that makes up the metallic phase.

As will be described below, the form above is better in thermal conduction because the bonding layer brings the substrate and the insulating plate into intimate contact with each other and is small in thickness.

The form can be manufactured, for example, by employing a brazing material composed of an alloy containing titanium (Ti) and based on a main metal element that makes up the metallic phase in the substrate for bonding the substrate and the insulating plate to each other. As will be described later, at the time of bonding, Ti reacts with carbon (C) that makes up diamond in the substrate and with nitrogen (N) that makes up AlN that makes up the insulating plate. As a result of such reaction, the substrate and the insulating plate can be in intimate contact with each other. Furthermore, as described above, at the time of bonding, the main metal element or an additive element in the brazing material diffuses into the metallic phase in the substrate and the bonding layer can readily be smaller in thickness. In particular, by setting a specific bonding condition which will be described later, diffusion of a constituent element of the brazing material described above into the metallic phase and reaction between Ti and carbon in diamond and reaction between Ti and nitrogen in AlN can be accelerated. Therefore, the substrate and the insulating plate can more reliably be brought in intimate contact with each other and the bonding layer can more reliably be smaller in thickness.

(3) An exemplary form of the heat radiation member according to the present disclosure may be such that a constituent metal of the metallic phase is pure silver or a silver-based alloy.

The metallic phase in the substrate in the form above is mainly composed of silver (Ag) high in thermal conductivity among metals. Therefore, the form is better in thermal conduction. In this form, in a manufacturing process, a brazing material composed of an alloy based on Ag may be employed for bonding between the substrate and the insulating plate.

(4) An exemplary form of the heat radiation member in (3) may be such that the bonding layer is composed of an alloy containing Ag, Cu, and Ti, and a concentration of Ti in the bonding layer is not lower than 40 atomic % and not higher than 95 atomic % with a total amount of Ag, Cu, and Ti being defined as 100 atomic %.

The form above can be manufactured, for example, by employing a brazing material composed of a silver-based alloy containing copper (Cu) and Ti or representatively a silver-based alloy based on a eutectic alloy of Ag and Cu and containing Ti, for bonding between the substrate and the insulating plate. The brazing material is readily molten and readily dissolved into the metallic phase in the substrate. By employing such a brazing material, the substrate and the insulating plate are readily brought in intimate contact with each other. As Ag or Cu in the brazing material is diffused into the metallic phase in the substrate as described above, the bonding layer is readily made smaller in thickness. The form is thus better in thermal conduction.

In particular, the form is further better in thermal conduction because the concentration of Ti in the bonding layer satisfies the range described above. This may be because an appropriate amount of Ti is contained in the bonding layer, and hence in the manufacturing process, reaction between Ti and carbon in diamond and reaction between Ti and nitrogen in AlN described above appropriately occur so that an effect of intimate contact between the substrate and the insulating plate may satisfactorily be obtained. In addition, in the bonding layer, increase in thermal resistance due to an excessive content of Ti can be suppressed in the bonding layer.

Description of Embodiments

An embodiment of the present disclosure will specifically be described below with reference to the drawings as appropriate. The same elements have the same reference characters allotted in the drawings.

[Heat Radiation Member]

A heat radiation member 1 in the embodiment will be described mainly with reference to FIGS. 1A and 1B.

Figure 1A:
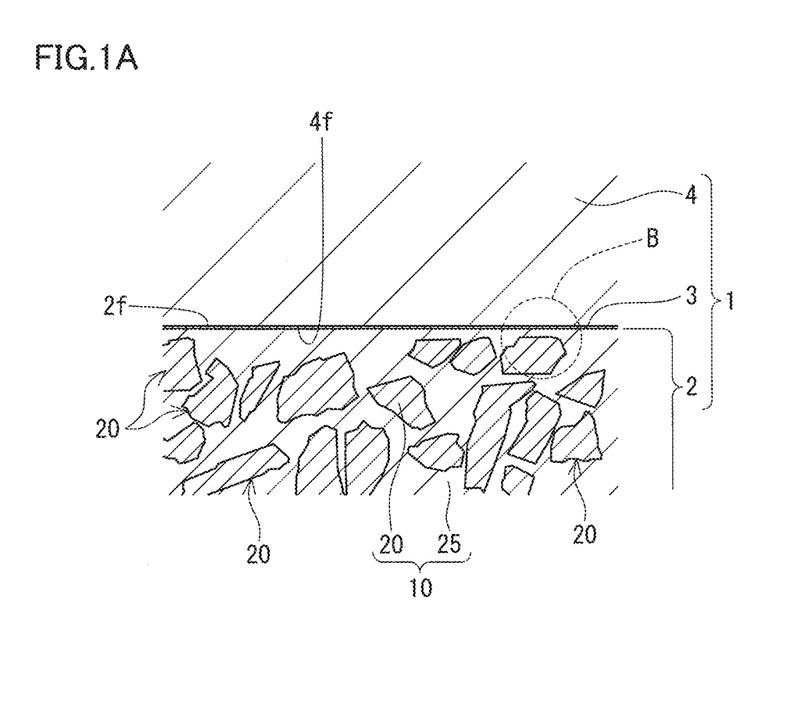
FIG. 1A is a partial cross-sectional view schematically showing a heat radiation member in an embodiment.
Figure 1B:
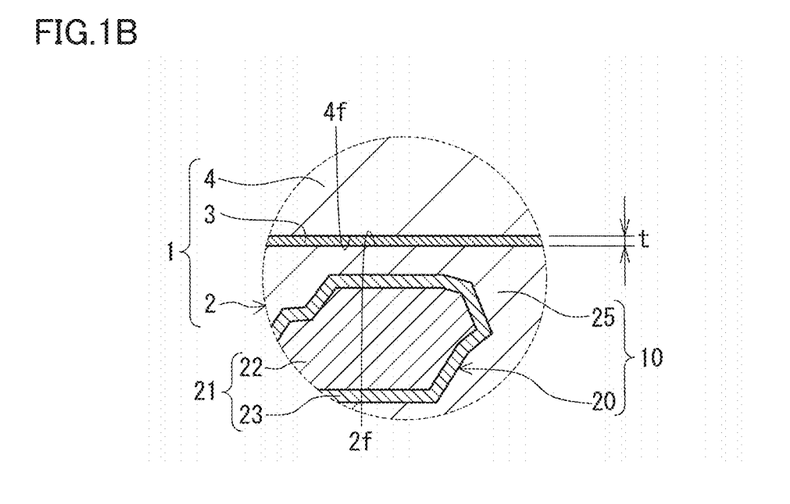
FIG. 1B is a partially enlarged cross-sectional view showing as being enlarged, a region encircled with a dashed circle B of the heat radiation member in the embodiment shown in FIG. 1A.

FIGS. 1A and 1B are partial cross-sectional views schematically showing the vicinity of a bonding layer 3 in heat radiation member 1. This cross-sectional view is a cut-away view of heat radiation member 1 along a plane in parallel to a thickness direction of a substrate 2. The thickness direction of substrate 2 corresponds to the thickness direction of an insulating plate 4. The thickness direction of substrate 2 corresponds to a direction of stack of substrate 2, bonding layer 3, and insulating plate 4. In FIGS. 1A and 1B, the thickness direction of substrate 2 corresponds to the vertical direction on the sheet plane.

Overview

As shown in FIG. 1A, heat radiation member 1 in the embodiment includes substrate 2, insulating plate 4 provided on at least a part of front and rear surfaces of substrate 2, and bonding layer 3 interposed between substrate 2 and insulating plate 4. Substrate 2 is composed of a composite material 10 containing diamond 20 and a metallic phase 25. Insulating plate 4 is composed of aluminum nitride (AlN).

In particular in heat radiation member 1 in the embodiment, single bonding layer 3 is interposed between substrate 2 and insulating plate 4. Only a single bonding layer 3 is substantially present between substrate 2 and insulating plate 4 so to speak. Heat radiation member 1 in which single bonding layer 3 bonds substrate 2 and insulating plate 4 to each other is higher in thermal conduction than in an example in which a nickel plated layer is included between substrate 2 and insulating plate 4. Quantitatively, heat radiation member 1 has thermal conductivity not lower than 400 W/m·K.

Detailed description will be given below for each constituent element.

(Substrate)

A substrate composed of composite material 10 mainly composed of diamond 20 which makes up a non-metallic phase and metallic phase 25 can be employed as appropriate as substrate 2 provided in heat radiation member 1.

<Non-Metallic Phase>

<<Composition>>

Diamond 20 representatively has high thermal conductivity not lower than 1000 W/m·K. Diamond 20 is substantially free from anisotropy in thermal conduction. Therefore, heat radiation member 1 including substrate 2 containing diamond 20 is excellent in thermal conduction.

In addition to diamond 20, one type of non-metallic inorganic material or a plurality of types of non-metallic inorganic materials other than diamond 20 may be contained as the non-metallic phase in composite material 10. Examples of the non-metallic inorganic material other than diamond 20 include a carbon-based material other than diamond 20 and various ceramic materials. Examples of the carbon-based material include graphite, carbon nanotubes, and carbon fibers. Examples of ceramic include oxide, carbide (for example, silicon carbide), nitride (for example, cubic boron nitride), boride, chloride, and silicide of a metal or a non-metal (for example, alumina). Examples of other non-metallic inorganic materials include a silicon-based material.

<<Form of Presence>>

The non-metallic phase such as diamond 20 may include particles as shown in FIG. 1A. The non-metallic phase may entirely be provided as particles. A plurality of particles that make up the non-metallic phase are present as being distributed in metallic phase 25. Alternatively, the non-metallic phase such as diamond 20 may include a porous body (not shown) with a three-dimensional network structure. Examples of the porous body such as silicon carbide representatively include a sintered material. Metallic phase 25 is present in such a form that pores in the porous body are filled therewith.

The non-metallic phase such as diamond 20 may include coated particles 21 as shown in FIG. 1B as being enlarged. Coated particle 21 includes a core particle 22 composed of a non-metallic inorganic material such as diamond 20 and a coating layer 23 that covers at least a part of a surface or preferably substantially the entire surface of core particle 22. Though FIG. 1B shows a thick coating layer 23 for the sake of facilitated understanding, it is actually very small in thickness.

Examples of coated particle 21 include such a particle that core particle 22 is a diamond particle and coating layer 23 is composed of carbide. With the carbide layer on the surface of the diamond particle, wettability of coated particles 21 with a molten metal can be enhanced in the manufacturing process. Therefore, production of an unimpregnated portion can be suppressed and densification and compositeness can satisfactorily be achieved. Therefore, dense composite material 10 in which diamond 20 and metallic phase 25 are in intimate contact with each other can be obtained. Substrate 2 composed of such composite material 10 is excellent in thermal conduction and preferred.

Examples of a constituent material of the carbide layer described above include carbide containing at least one element selected from the group consisting of silicon (Si), Ti, zirconium (Zr), hafnium (Hf), tantalum (Ta), and chromium (Cr). Specific examples include SiC, TiC, ZrC, HfC, TaC, and $Cr_3C_2$. Carbon (C) that makes up carbide is representatively derived from diamond 20. Therefore, the diamond particle and the carbide layer are in intimate contact with each other. The thermal conduction is excellent also in this regard.

Such particles that core particles 22 are composed of ceramic such as SiC and coating layer 23 is composed of oxide such as silicon oxide may be included as other coated particles 21. Such coated particles 21 are also excellent in wettability with a molten metal. Coated particles 21 different in composition of at least one of core particles 22 and coating layer 23 may be included. When the non-metallic phase such as diamond 20 contains the porous body described above, a coating layer composed of carbide or oxide described above may be provided on at least a part of the surface of the porous body.

<<Size>>

When the non-metallic phase such as diamond 20 contains particles, the particles (including coated particles 21) may have an average particle size, for example, not smaller than 1 μm and not larger than 300 μm.

When the average particle size is equal to or larger than 1 grain boundaries of the non-metallic phase particles such as diamond 20 in composite material 10 can be reduced. As the grain boundaries are fewer, thermal conduction is higher. Therefore, heat radiation member 1 including substrate 2 composed of composite material 10 fewer in grain boundaries is excellent in thermal conduction. As the average particle size is larger, the grain boundaries can be reduced and thermal conduction is better. When improvement in thermal conduction is desired, the average particle size may be not smaller than 5 or furthermore, not smaller than 10 not smaller than 15 or not smaller than 20 μm.

When the average particle size is equal to or smaller than 300 projections and recesses at a surface 2f of substrate 2 tends to be small. When substrate 2 is polished in the manufacturing process, recesses resulting from coming off of particles of the non-metallic phase such as diamond 20 are readily made smaller. Therefore, substrate 2 excellent in surface property can be obtained. Workability in polishing or the like is also excellent. As the average particle size is smaller, projections and recesses at surface 2f of substrate 2 are readily made smaller. Workability of substrate 2 is excellent. Furthermore, substrate 2 is readily made smaller in thickness. When improvement in surface property, improvement in workability, or decrease in thickness is desired, the average particle size may be not larger than 290 or furthermore, not larger than 280 μm, not larger than 270 μm, or not larger than 260 μm. The average particle size may be not larger than 100 μm.

So long as the average particle size satisfies a range not smaller than 1 μm and not larger than 300 μm, a mixed form containing relatively fine particles and relatively coarse particles may be employed. In this case, substrate 2 that is readily made denser and high in relative density is readily obtained in the manufacturing process. Heat radiation member 1 including dense substrate 2 is excellent in thermal conduction.

The average particle size may be measured, for example, by extracting particles of the non-metallic phase such as diamond 20 from substrate 2 and measuring a median diameter of the particles with a commercially available analysis apparatus. The non-metallic phase may be extracted, for example, by selectively dissolving metallic phase 25 with an acid and removing the metallic phase.

<<Content>>

A content (a total content when a plurality of types of non-metallic inorganic materials are contained) of the non-metallic phase such as diamond 20 may be, for example, not lower than 40 volume % and not higher than 90 volume %.

When the content is equal to or higher than 40 volume %, composite material 10 can be excellent in thermal conduction. Composite material 10 is readily made smaller in linear expansion coefficient than metallic phase 25. Heat radiation member 1 including substrate 2 composed of such composite material 10 is excellent in thermal conduction and excellent in compatibility in linear expansion coefficient with a semiconductor element and a peripheral device thereof. Therefore, heat radiation member 1 can suitably be used as a heat radiation member for a semiconductor element. As the content is higher, thermal conduction is better. When improvement in thermal conduction is desired, the content may be not lower than 45 volume %, or furthermore, not lower than 50 volume %, not lower than 55 volume %, or not lower than 60 volume %.

When the content is equal to or lower than 90 volume %, composite material 10 contains metallic phase 25 to some extent. Therefore, too much a non-metallic phase such as diamond 20 which leads to too small a linear expansion coefficient of composite material 10 can be prevented. When the non-metallic phase contains particles, the particles can reliably be bonded to one another by metallic phase 25. Furthermore, when the content is equal to or lower than 90 volume %, in the manufacturing process, a non-metallic inorganic material such as diamond to be used as a source material is readily impregnated with a molten metal. Therefore, production of an unimpregnated portion can be suppressed and densification and compositeness are satisfactorily achieved. When ensured presence of metallic phase 25 and densification and satisfactory compositeness thereof are desired, the content may be not higher than 85 volume %, or furthermore, not higher than 80 volume %.

Specifications such as a shape, a size, or a content of the particles (including coated particles 21) or the porous body that make(s) up the non-metallic phase such as diamond 20 can be selected as appropriate. Representatively, the specifications of source material powders are substantially maintained as the specifications of the particles. The specifications of a sintered material employed as a source material are representatively substantially maintained as the specifications of the porous body. The specifications of a source material may be selected such that the non-metallic phase in composite material 10 satisfies prescribed specifications.

<Metallic Phase>

Examples of a metal that makes up metallic phase 25 include pure silver or a silver-based alloy, pure copper or a copper-based alloy, pure aluminum (Al) or an aluminum-based alloy, and pure magnesium (Mg) or a magnesium-based alloy. A pure metal tends to be higher in thermal conductivity than an alloy. Therefore, when a constituent metal of metallic phase 25 is a pure metal, substrate 2 better in thermal conduction can be obtained. In addition, heat radiation member 1 better in thermal conduction can be obtained. A content of the main metal element (Ag, Cu, Al, and Mg) in the silver-based alloy, the copper-based alloy, the aluminum-based alloy, and the magnesium-based alloy exceeds 50 mass %. When the content of the main metal element is equal to or higher than 80 mass %, or furthermore, equal to or higher than 90%, thermal conduction tends to be higher. The alloy tends to be better in mechanical characteristics such as strength than the pure metal. Therefore, when the constituent metal of metallic phase 25 is an alloy, substrate 2 excellent in mechanical characteristics can be obtained. In addition, heat radiation member 1 excellent in mechanical characteristics can be obtained.

Pure silver or the silver-based alloy is mainly composed of Ag high in thermal conductivity among metals. Therefore, when the constituent metal of metallic phase 25 is pure silver or the silver-based alloy, heat radiation member 1 excellent in thermal conduction can be obtained, which is preferred. In particular, when the constituent metal of metallic phase 25 is pure silver, heat radiation member 1 better in thermal conduction can be obtained. Pure silver or the silver-based alloy is higher in heat resistance than pure aluminum, pure magnesium, or an alloy thereof. Therefore, heat radiation member 1 excellent in heat resistance can be obtained.

When the constituent metal of metallic phase 25 is pure copper or the copper-based alloy, substrate 2 higher in thermal conduction than pure aluminum, pure magnesium, or an alloy thereof can be obtained and substrate 2 lighter in weight than pure silver or the silver-based alloy can be obtained. When the constituent metal of metallic phase 25 is pure aluminum, pure magnesium, or an alloy thereof, substrate 2 light in weight can be obtained.

A known composition can be employed for the silver-based alloy, the copper-based alloy, the aluminum-based alloy, and the magnesium-based alloy.

(Outer Geometry and Size)

A two-dimensional shape and a size (a thickness and a two-dimensional area) of substrate 2 can be selected as appropriate depending on an application of heat radiation member 1. For example, when heat radiation member 1 is used as a heat radiation member for a semiconductor element, the two-dimensional shape of substrate 2 may be rectangular. In this application, the two-dimensional area of substrate 2 may be as large as an area that allows mount of a component such as a semiconductor element. As substrate 2 is smaller in thickness, heat from a heat generator (to be cooled) such as a semiconductor element readily conducts to an object such as a cooling apparatus on which the heat generator is to be provided, which is preferred. For example, when substrate 2 has a thickness not larger than 10 mm, or furthermore, not larger than 5 mm, substrate 2 is small in thickness and excellent in thermal conduction, which is preferred. Substrate 2 having a thickness, for example, not smaller than 0.2 mm is easy to use.

(Insulating Plate)

An insulating plate composed of AlN can be employed as appropriate as insulating plate 4 included in heat radiation member 1. Insulating plate 4 is used for enhancing electrical insulation between composite material 10 that makes up substrate 2, in particular, metallic phase 25, and the heat generator such as a semiconductor element to which heat radiation member 1 is attached. AlN is excellent in electrical insulation among ceramic materials. Therefore, insulating plate 4 composed of AlN satisfactorily functions as an electrically insulating material between substrate 2 described above and the heat generator such as the semiconductor element. AlN is high in thermal conductivity among ceramic materials. Therefore, increase in thermal resistance caused by insulating plate 4 composed of AlN is readily suppressed and heat radiation member 1 excellent in thermal conduction can be obtained.

One heat radiation member 1 includes one insulating plate 4 or a plurality of insulating plates 4. The number of insulating plates 4 or a position of arrangement of insulating plate 4 on substrate 2 can be selected as appropriate depending on an application of heat radiation member 1. Insulating plate 4 may be provided on only one of front and rear surfaces of substrate 2 or on both of the front and rear surfaces. One insulating plate 4 or a plurality of insulating plates 4 may be provided on one surface of substrate 2. The front surface and the rear surface of substrate 2 may be different from each other in number of insulating plates 4 thereon.

The two-dimensional shape and the two-dimensional area of insulating plate 4 should only be selected depending on a shape or a size of a region in substrate 2 where electrical insulation is required. Examples of representative insulating plate 4 include a flat plate in a rectangular two-dimensional shape. When heat radiation member 1 includes a plurality of insulating plates 4, all insulating plates 4 may be identical in shape or size or the plurality of insulating plates 4 may include insulating plates 4 different in shape or two-dimensional area.

As insulating plate 4 is larger in thickness, electrical insulation thereof is better. As insulating plate 4 is smaller in thickness, increase in thermal resistance caused by insulating plate 4 can be suppressed. Then, thermal conductivity of heat radiation member 1 including insulating plate 4 is readily made higher. For example, when insulating plate 4 has a thickness not smaller than 0.05 mm and not larger than 2 mm, an effect such as good electrical insulation and suppression of increase in electrical resistance is readily obtained, which is preferred.

(Bonding Layer)

Bonding layer 3 provided in heat radiation member 1 is interposed between substrate 2 and insulating plate 4 and in direct contact with substrate 2 and insulating plate 4. When heat radiation member 1 includes a plurality of insulating plates 4, bonding layer 3 is interposed between substrate 2 and each insulating plate 4. In particular, single bonding layer 3 is provided. Representatively, bonding layer 3 is formed from a single layer composed of an alloy based on a brazing material used in the manufacturing process. The alloy that makes up bonding layer 3 can substantially be regarded as being composed of a single composition. Therefore, bonding layer 3 does not have a multi-layered structure including a plurality of metal layers such as the nickel plated layer.

<Composition>

A constituent material of bonding layer 3 is representatively an alloy containing a constituent material of a brazing material used in the manufacturing process. In the process for manufacturing heat radiation member 1, a brazing material may be used for bonding substrate 2 and insulating plate 4 to each other. In particular, a brazing material composed of an alloy based on a main metal element that makes up metallic phase 25 in composite material 10 that makes up substrate 2 can suitably be used as the brazing material because bonding layer 3 is readily made smaller in thickness as will be described below. The metal element serving as the base for the brazing material is common to the metal element serving as the base for metallic phase 25 in substrate 2. Therefore, at the time of bonding, the metal element serving as the base for the brazing material or an additive element readily diffuse into metallic phase 25 in substrate 2. In particular, by setting a specific bonding condition which will be described later, diffusion can be accelerated. Diffusion of the constituent element of the brazing material into metallic phase 25 can lead to a smaller thickness of bonding layer 3. With bonding layer 3 small in thickness, heat radiation member 1 excellent in thermal conduction can be obtained.

By way of example of the composition of bonding layer 3, bonding layer 3 may contain at least one element selected from the group consisting of Ag, Cu, Al, and Mg. For example, when the constituent metal of metallic phase 25 in substrate 2 is pure silver or the silver-based alloy, a brazing material composed of the silver-based alloy can be used for bonding substrate 2 and insulating plate 4 to each other in the manufacturing process. By using the brazing material composed of the silver-based alloy, bonding layer 3 containing Ag can be formed. Similarly, when the constituent metal of metallic phase 25 is pure copper or the copper-based alloy, bonding layer 3 containing Cu can be formed by using a brazing material composed of the copper-based alloy. This is also applicable to Al and Mg.

By way of another example of the composition of bonding layer 3, bonding layer 3 may be composed of an alloy containing Ti and a main metal element that makes up metallic phase 25 in substrate 2. Bonding layer 3 composed of the alloy can be formed, for example, by employing a brazing material composed of an alloy containing Ti and based on the main metal element that makes up metallic phase 25 described above for bonding substrate 2 and insulating plate 4 to each other.

When the brazing material and metallic phase 25 are common to each other in base metal element, the constituent element of the brazing material readily diffuses into metallic phase 25 during bonding as described above. Consequently, bonding layer 3 formed based on the brazing material can be smaller in thickness. In particular, by setting a specific bonding condition which will be described later, diffusion of the constituent element of the brazing material described above into metallic phase 25 is accelerated and bonding layer 3 is readily further made smaller in thickness.

Furthermore, Ti in the brazing material forms TiC as a result of reaction with carbon that makes up diamond 20 in substrate 2 during bonding. TiC can improve wettability of diamond 20 with the molten brazing material. Therefore, the brazing material can be in intimate contact with substrate 2. Ti in the brazing material forms TiN as a result of reaction with nitrogen in AlN that makes up insulating plate 4 during bonding. TiN can improve wettability of AlN with the molten brazing material. Therefore, the brazing material can be in intimate contact with insulating plate 4. As a result of both of reaction between Ti and carbon in diamond 20 and reaction of Ti and nitrogen in AlN, bonding layer 3 formed based on the brazing material can bring substrate 2 and insulating plate 4 into intimate contact with each other. In particular, by setting a specific bonding condition which will be described later, both of reactions described above can be accelerated. Consequently, bonding layer 3 can more reliably bring substrate 2 and insulating plate 4 into intimate contact with each other.

As described above, by using the brazing material composed of an alloy containing Ti and based on the main metal element that makes up metallic phase 25, bonding layer 3 composed of the alloy containing the constituent element of the brazing material can be smaller in thickness. Even a single bonding layer 3 composed of the alloy can bring substrate 2 and insulating plate 4 into intimate contact with each other. Therefore, heat radiation member 1 excellent in thermal conduction can be obtained.

When the constituent metal of metallic phase 25 in substrate 2 is pure silver or the silver-based alloy, an alloy containing Ag, Cu, and Ti represents yet another example of the composition of bonding layer 3. Bonding layer 3 can be formed, for example, by employing a brazing material composed of the silver-based alloy containing Cu and Ti for bonding substrate 2 and insulating plate 4 to each other. Examples of the silver-based alloy containing Cu and Ti include a silver-based alloy based on a eutectic alloy of Ag and Cu and containing Ti. The brazing material composed of the eutectic alloy is readily molten and readily dissolved into metallic phase 25 in substrate 2. Therefore, by employing the brazing material, substrate 2 and insulating plate 4 are readily brought into intimate contact with each other. Ag or Cu in the brazing material readily diffuses into metallic phase 25 in substrate 2 during bonding. As a result of diffusion, bonding layer 3 is readily made smaller in thickness.

Since the brazing material contains Ti, substrate 2 and insulating plate 4 are more readily brought into intimate contact with each other as a result of reaction between Ti described above and the constituent element of diamond 20 or AlN. Furthermore, metallic phase 25 is mainly composed of Ag high in thermal conductivity. Thus, heat radiation member 1 better in thermal conduction can be obtained.

When bonding layer 3 is composed of the alloy containing Ag, Cu, and Ti, a constituent material of bonding layer 3 may contain an element other than Ag, Cu, and Ti (which is called other elements in the present paragraph below). Examples of other elements include tin (Sn), zinc (Zn), and indium (In). A total content of other elements may be, for example, equal to or lower than 5.0 atomic %. When the total content is equal to or lower than 5.0 atomic %, increase in thermal resistance caused by containing other elements is readily suppressed. Bonding layer 3 containing other elements can be manufactured, for example, by employing a brazing material composed of the silver-based alloy containing Cu, Ti, and other elements.

When bonding layer 3 is composed of the alloy containing Ag, Cu, and Ti, a concentration of Ti in bonding layer 3 may be not lower than 40 atomic % and not higher than 95 atomic % with a total amount of Ag, Cu, and Ti being defined as 100 atomic %. An example in which the brazing material composed of the silver-based alloy based on the eutectic alloy of Ag and Cu and containing Ti is employed is considered. The concentration of Ti in the silver-based alloy that makes up the brazing material may be, for example, not lower than 0.5 atomic % and not higher than 3.0 atomic % with the total amount of Ag, Cu, and Ti being defined as 100 atomic %. During bonding, Ag or Cu in the brazing material diffuses into metallic phase 25 in substrate 2 as described above. During bonding, Ti in the brazing material reacts with the constituent element of diamond 20 or AlN as described above and remains in a region between substrate 2 and insulating plate 4. Therefore, a ratio of Ti to the total amount of Ag, Cu, and Ti in the region increases. Consequently, the concentration of Ti in finally obtained bonding layer 3 is relatively high. At least some of Ti in bonding layer 3 may be present as TiC or TiN.

When the concentration of Ti in bonding layer 3 is equal to or higher than 40 atomic % with the total amount of Ag, Cu, and Ti being defined as 100 atomic %, an appropriate amount of Ti is contained in bonding layer 3. Therefore, in the manufacturing process, reaction between Ti described above and the constituent element of diamond 20 or AlN may appropriately occur and substrate 2 and insulating plate 4 may satisfactorily be brought into intimate contact with each other. As a result of intimate contact between substrate 2 and insulating plate 4, heat radiation member 1 better in thermal conduction can be obtained. As the concentration of Ti is higher, the effect of intimate contact between substrate 2 and insulating plate 4 is more reliably obtained and thermal conduction is more readily enhanced. Therefore, the concentration of Ti is preferably not lower than 50 atomic %, or furthermore, not lower than 55 atomic % or not lower than 60 atomic % with the total amount of Ag, Cu, and Ti being defined as 100 atomic %.

When the concentration of Ti in bonding layer 3 is equal to lower than 95 atomic % with the total amount of Ag, Cu, and Ti being defined as 100 atomic %, Ti can be concluded as not excessively being present in bonding layer 3. Therefore, increase in thermal resistance caused by excessively containing Ti in bonding layer 3 can be suppressed and heat radiation member 1 excellent in thermal conduction can be obtained. As the concentration of Ti is lower, increase in thermal resistance caused by excessively containing Ti described above is more readily suppressed and thermal conduction is more readily enhanced. Therefore, the concentration of Ti may be not higher than 90 atomic %, or furthermore, not higher than 85 atomic % or not higher than 80 atomic % with the total amount of Ag, Cu, and Ti being defined as 100 atomic %.

A constituent material of bonding layer 3 is dependent on a manufacturing condition such as a composition of the brazing material or a bonding condition adopted in the manufacturing process. The composition of the brazing material or the manufacturing condition may be adjusted such that the concentration of Ti described above satisfies the prescribed range described above.

<<Measurement of Composition of Bonding Layer>>

Component analysis of bonding layer 3 may be conducted, for example, as below.

A cross-section is obtained by cutting heat radiation member 1 along a plane in parallel to the thickness direction (a direction corresponding to the direction of stack of substrate 2, bonding layer 3, and insulating plate 4) of heat radiation member 1.

The cross-section is observed with a scanning electron microscope (SEM) to extract a region interposed between substrate 2 and insulating plate 4 (which is called an observed region below). In other words, a region lying between surface 2f of substrate 2 and a surface 4f of insulating plate 4 (a surface opposed to substrate 2) is extracted as the observed region. FIGS. 1A and 1B show surfaces 2f and 4f with straight lines for the sake of facilitated understanding. At least one observed region is extracted from one cross-section. A plurality of cross-sections may be taken and the observed region may be extracted from each cross-section.

In the extracted observed region, a plurality of points (for example, ten points) different in position in a creepage direction on surface 2f of substrate 2 or surface 4f of insulating plate 4 are set as measurement points.

At each measurement point, component analysis is conducted at a central position in the thickness direction. For component analysis, for example, energy dispersive X-ray spectroscopy (EDX) can be employed. A content (atomic %) of each element is calculated with a total content of elements (for example, Ag, Cu, Ti, and other elements described above) detected at one measurement point being defined as 100 atomic %.

A result of analysis at the plurality of measurement points is used and contents of each element are averaged. An average value of the contents of each element is defined as the content of each element in the constituent material of bonding layer 3.

Single bonding layer 3 can be confirmed, for example, by setting the cross-section of heat radiation member 1 as described above and observing the cross-section with a microscope (for example, the SEM or a metallograph). In observation with the SEM, a secondary electron image may be used.

<<Other Elements>>

An element derived from substrate 2 (for example, C or a main metal element that makes up metallic phase 25) or an element derived from insulating plate 4 (for example, Al or N) may be permitted to be included in a component analyzed as described above. The "main metal element that makes up metallic phase 25" included in the component analyzed as described above is handled as a metal element contained at the measurement point.

<Thickness>

Bonding layer 3 may have a thickness, for example, not smaller than 0.1 µm and not larger than 10 µm.

When bonding layer 3 has a thickness not larger than 10 increase in thermal resistance caused by bonding layer 3 can be suppressed. Therefore, heat radiation member 1 excellent in thermal conduction can be obtained. As bonding layer 3 is smaller in thickness, increase in thermal resistance caused by bonding layer 3 is readily suppressed. Therefore, bonding layer 3 has a thickness preferably not larger than 9 or furthermore, not larger than 8 µm or not larger than 5 µm, or more preferably not larger than 3 µm. Depending on a bonding condition which will be described later, bonding layer 3 can have a thickness not larger than 1 µm.

When bonding layer 3 has a thickness not smaller than 0.1 bonding layer 3 can bring substrate 2 and insulating plate 4 into intimate contact with each other. When bonding layer 3 has a thickness not smaller than 0.1 time required for bonding is not excessively long in the manufacturing process and manufacturability of heat radiation member 1 is excellent. When ensured presence of bonding layer 3 or improvement in manufacturability is desired, bonding layer 3 may have a thickness not smaller than 0.3 or furthermore, not smaller than 0.5 µm.

The bonding condition may be adjusted in accordance with a composition or a thickness of the brazing material so as to set the thickness of bonding layer 3 to a prescribed thickness.

<<Measurement of Thickness of Bonding Layer>>

The thickness of bonding layer 3 may be measured, for example, as below.

As described in <<Measurement of Composition of Bonding Layer>> above, an observed region is extracted from a cross-section and a plurality of different measurement points are set in the observed region. Details are as described above.

A distance along the thickness direction between surface 2*f* of substrate 2 and surface 4*f* of insulating plate 4 at each measurement point is found.

The distances at the plurality of measurement points (for example, ten points) is averaged. The average value is defined as a thickness t (FIG. 1B) of bonding layer 3.

(Thermal Characteristics)

Heat radiation member 1 in the embodiment, inclusive of insulating plate 4, has thermal conductivity not lower than 400 W/m·K. With insulating plate 4, heat radiation member 1 is excellent in electrical insulation. Additionally, heat radiation member 1 inclusive of insulating plate 4 has thermal conductivity as high as at least 400 W/m·K, and hence it is excellent also in thermal conduction. As heat radiation member 1 is higher in thermal conductivity, it is higher in thermal conduction, which is preferred. Therefore, heat radiation member 1 has thermal conductivity preferably not lower than 410 W/m·K, or furthermore, not lower than 420 W/m·K.

(Application)

Heat radiation member 1 in the embodiment can suitably be used as a heat radiation member for a semiconductor element. Examples of a semiconductor device including heat radiation member 1 include various electronic devices. Specific examples of the electronic devices include a high-frequency power device (for example, an LDMOS), a semiconductor laser device, and a light emitting diode device. Other examples of the electronic devices include a central processing unit (CPU) of various computers, a graphics processing unit (GPU), a high electron mobility transistor (HEMT), a chip set, and a memory chip. In particular, heat radiation member 1 is suitable for a heat radiation member for a semiconductor element that generates a large amount of heat such as an SiC device or a GaN device.

Method of Manufacturing Heat Radiation Member

Heat radiation member 1 in the embodiment can be manufactured, for example, by a manufacturing method including a preparation step below and a bonding step below.

(Preparation Step) Step of preparing substrate 2 composed of composite material 10 containing diamond 20 and metallic phase 25 and insulating plate 4 composed of AlN (Bonding Step) Step of bonding substrate 2 and insulating plate 4 to each other with a brazing material (not shown)

Description will be given below for each step.

(Preparation Step)

A known substrate and a known insulating plate can be employed for substrate 2 and insulating plate 4 prepared in the preparation step. Alternatively, substrate 2 and insulating plate 4 may be manufactured by a known manufacturing method. For example, a substrate composed of a composite material of diamond and silver described in PTL 1 can be employed as substrate 2. Alternatively, the method of manufacturing the substrate described in PTL 1 can be employed.

A region where insulating plate 4 is to be bonded in front and rear surfaces of substrate 2 is not subjected to coating treatment such as metal plating treatment, metallization treatment, or sputtering, but diamond 20 or metallic phase 25 is exposed. A region of bonding of insulating plate 4 to substrate 2 is not subjected to coating treatment such as metal plating treatment described above but AlN is exposed. A metal layer or a metal film (for example, a plated layer composed of nickel or a nickel alloy) formed by coating treatment described above causes increase in thermal resistance. By subjecting neither of substrate 2 and insulating plate 4 to coating treatment, no metal layer or metal film is interposed between substrate 2 and insulating plate 4 and heat radiation member 1 excellent in thermal conduction can be manufactured.

(Bonding Step)

In the bonding step, initially, a brazing material is prepared. Examples of the brazing material include a brazing material composed of an alloy based on the main metal element that makes up metallic phase 25 in composite material 10 that makes up substrate 2 as described above. This is because, during bonding, the metal element serving as the base in the brazing material or an additive element readily diffuses into metallic phase 25 of substrate 2 as described above and bonding layer 3 can be smaller in thickness.

For example, when the constituent metal of metallic phase 25 in substrate 2 is pure silver or the silver-based alloy, a brazing material composed of the silver-based alloy may be employed. Examples of the composition of the brazing material composed of the silver-based alloy include a silver-based alloy containing at least 25 mass % and at most 35 mass % of Cu (with the silver-based alloy being defined as 100 mass %, to be understood similarly below). Examples of the composition of the brazing material composed of the silver-based alloy containing Ti include a silver-based alloy containing at least 25 mass % and at most 35 mass % of Cu, at least 1.0 mass % and at most 3.0 mass % of Ti, and at least 62 mass % and at most 74 mass % of Ag. The silver-based alloy containing Cu within the range can be concluded as an alloy based on a eutectic alloy of Ag and Cu. The brazing material composed of the silver-based alloy based on the eutectic alloy is readily molten and readily dissolved into metallic phase 25 of substrate 2. By employing such a brazing material, substrate 2 containing metallic phase 25 composed of pure silver or the silver-based alloy and insulating plate 4 can satisfactorily be bonded to each other. In particular, when Ti is contained, substrate 2 and insulating plate 4 can be brought in intimate contact with each other owing to reaction between Ti and carbon that makes up diamond 20 in substrate 2 and reaction between Ti and nitrogen that makes up AlN in insulating plate 4 as described above.

<Bonding Condition>

The bonding condition is preferably adjusted such that finally formed bonding layer 3 is minimized in thickness. Representatively, the bonding condition may be adjusted such that bonding layer 3 has a thickness not larger than 10 μm. In order to decrease a thickness of bonding layer 3, for example, diffusion of the constituent element of the brazing material into metallic phase 25 of substrate 2 as described above may be accelerated. Examples of such a condition include a heating temperature higher than a recommended condition which will be described later and a heating time period longer than the recommended condition.

There is a bonding condition recommended in accordance with a composition of the brazing material. Examples of the recommended condition for the brazing material composed of the silver-based alloy based on the eutectic alloy of Ag and Cu and containing Ti described above include a heating temperature of 800° C. and a heating time period of five minutes.

By setting the heating temperature and the heating time period to be higher and longer than the recommended condition during bonding, the brazing material can sufficiently be molten. Consequently, the brazing material is readily dissolved into metallic phase 25 in substrate 2 and substrate 2 and insulating plate 4 can be in intimate contact with each other. By setting the heating temperature and the heating time period to be higher and longer than the recommended condition, diffusion of the constituent element of the brazing material described above into metallic phase 25 can be accelerated. Consequently, bonding layer 3 can more reliably be made smaller in thickness. Even single bonding layer 3 can bring substrate 2 and insulating plate 4 in intimate contact with each other and bonding layer 3 can be smaller in thickness. Thus, heat radiation member 1 excellent in thermal conduction can be manufactured.

By setting the heating temperature and the heating time period to be higher and longer than the recommended condition in employing the brazing material containing Ti described above, during bonding, reaction between Ti and the constituent element of diamond 20 or AlN can be accelerated as described above. As reaction is accelerated, substrate 2 and insulating plate 4 are more readily brought into intimate contact with each other. Consequently, even single bonding layer 3 can more reliably bring substrate 2 and insulating plate 4 in intimate contact with each other and bonding layer 3 can be smaller in thickness. Thus, heat radiation member 1 better in thermal conduction can be manufactured.

<<Specific Example of Bonding Condition>>

When the brazing material composed of the silver-based alloy based on the eutectic alloy of Ag and Cu described above and containing Ti is employed, a heating temperature higher than the recommended condition may be set, for example, to a temperature not lower than 815° C. and not higher than 845° C. In this case, a heating time period longer than the recommended condition may exceed, for example, five minutes.

As the heating temperature described above is higher within the range described above, the metal element serving as the base for the brazing material or an additive element more readily diffuses into metallic phase 25 in substrate 2. Consequently, bonding layer 3 is more readily made smaller in thickness. When the brazing material has a relatively large thickness (for example, exceeding 100 μm), the heating temperature may be increased within the range or may be higher than the range.

As the heating time period described above is longer, diffusion of the constituent element of the brazing material described above into metallic phase 25 or reaction between Ti described above and the constituent element of diamond 20 or AlN is more readily accelerated. Therefore, the heating time period may be not shorter than ten minutes, or furthermore, not shorter than twenty five minutes, or furthermore, not shorter than thirty minutes. An excessively long heating time period lowers manufacturability. When satisfactory manufacturability is desired, the heating time period is desirably not longer than sixty minutes. A retention time period here means a time period during which the heating temperature is held and does not include a temperature increase process and a temperature lowering process. When the brazing material has a relatively large thickness (for example, exceeding 100 μm), the retention time period may be longer.

(Other Conditions)

The bonding condition can be adjusted as appropriate depending on a composition or a thickness of substrate 2 or a composition or a thickness of the brazing material. In addition, an applied pressure or an atmosphere in the bonding step may be set, for example, as below.

The applied pressure may be, for example, approximately not lower than 1 kPa and not higher than 100 kPa in an atmosphere during bonding. When the brazing material has a relatively large thickness (for example, exceeding 100 μm), the applied pressure may be higher.

A non-oxidizing atmosphere is preferred as the atmosphere, because oxidation of substrate 2 and the brazing material (in particular, Ti) can be prevented. Examples of the non-oxidizing atmosphere include a vacuum atmosphere, an inert atmosphere, and a reducing atmosphere.

Examples of the vacuum atmosphere include a low-pressure atmosphere lower than the atmospheric pressure. The pressure of the atmosphere may be, for example, not higher than 1 Pa.

Examples of the inert atmosphere include an argon atmosphere and a nitrogen atmosphere.

Examples of the reducing atmosphere include a hydrogen atmosphere, a mixed atmosphere of hydrogen gas and inert gas, and a carbon monoxide atmosphere.

[Main Functions and Effects]

Since heat radiation member 1 in the embodiment includes substrate 2 containing diamond 20 and insulating plate 4 composed of AlN, it is excellent in thermal conduction. The heat radiation member is excellent also in electrical insulation owing to insulating plate 4. Heat radiation member 1 includes single bonding layer 3 interposed between substrate 2 and insulating plate 4. Therefore, increase in thermal resistance based on a layer interposed between substrate 2 and insulating plate 4 can be suppressed. Therefore, heat radiation member 1 is better in thermal conduction and has high thermal conductivity not lower than 400

W/m·K. Excellent thermal conduction will be described specifically in a test example below.

First Test Example

A heat radiation member including a substrate and an insulating plate was made by bonding a substrate composed of a composite material containing diamond and a silver phase and an insulating plate composed of AlN to each other with a brazing material, and thermal conductivity of the heat radiation member was examined.
(Substrate)

A substrate made based on PTL 1 was prepared as the substrate made of the composite material. Coated particles each including a diamond particle and a coating layer that covers the diamond particle were prepared as diamond. The coating layer was composed of TiC. The diamond particles (the coated particles) had an average particle size of 20 μm. A content of the diamond particles was 60 volume %. The silver phase representing the metallic phase was composed of pure silver. The substrate was a rectangular flat plate material. The substrate had a thickness of 1.2 mm.

The average particle size of the diamond particles (the coated particles) was expressed by a median particle size. The median diameter was measured with a commercially available particle image analyzer. Examples of the commercially available particle image analyzer include Morphologi G3 (manufactured by Malvern Instruments).
(Brazing Material)

A sheet material composed of a silver-based alloy based on a eutectic alloy of Ag and Cu and containing Ti was employed as the brazing material. The brazing material was specifically composed of 30 mass % of Cu, 1.5 mass % of Ti, 3.0 mass of Sn, and the remainder composed of Ag and inevitable impurities. A melting temperature of the brazing material was 780° C. The sheet material had a thickness of 50 μm.
(Insulating Plate)

A commercially available flat plate composed of AlN was prepared as the insulating plate. The insulating plate had a thickness of 200 μm.

Neither of the substrate composed of the composite material and the insulating plate that were prepared was subjected to coating treatment such as metal plating treatment. Therefore, the surface of the substrate was composed of at least one of diamond and the metallic phase. The surface of the insulating plate was composed of AlN. The heat radiation member including the insulating plate was made by bonding the substrate and the insulating plate to each other with the prepared sheet material (brazing material).

Figure 2:
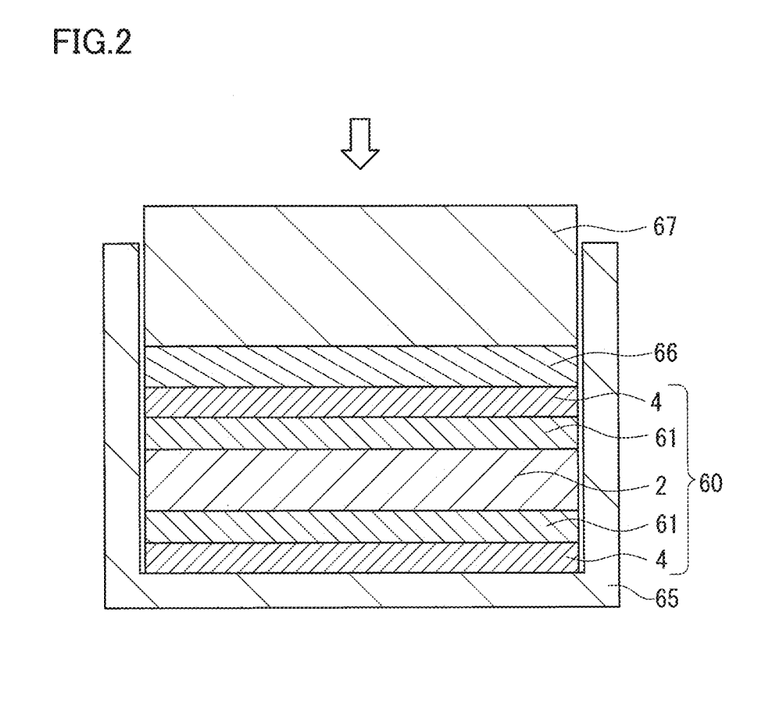
FIG. 2 is a diagram illustrating a method of manufacturing a sample in a first test example.

As shown in FIG. 2, a brazing material 61 was arranged on each of front and rear surfaces of substrate 2. Insulating plates 4 were arranged to sandwich an intermediate stack of brazing material 61, substrate 2, and brazing material 61. A stack 60 in the order of insulating plate 4, brazing material 61, substrate 2, brazing material 61, and insulating plate 4 was accommodated in a mold 65 made of carbon. Mold 65 was in a cylindrical shape with bottom. Stack 60 was accommodated in mold 65 such that a depth direction of mold 65 was in parallel to the direction of stack of stack 60. In this accommodation state, one (a lower one on the sheet plane in FIG. 2) insulating plate 4 was in contact with an inner surface of mold 65. A protective plate 66 made of carbon was arranged on the other (an upper one on the sheet plane in FIG. 2) insulating plate 4. A weight 67 was arranged on protective plate 66. Substrate 2 and insulating plate 4 were bonded to each other with brazing material 61 under a bonding condition below while a pressure was applied by weight 67 described above. For facilitating understanding, FIG. 2 shows each component of stack 60 with a thickness thereof being increased.
(Bonding Condition)
  Heating temperature (° C.): Table 1
  Heating time period (minutes): Table 1
  Atmosphere: Vacuum atmosphere
  Applied pressure (load applied by weight 67): 10 kPa The heating temperature (800° C.) and the heating time period (five minutes) as the bonding condition for sample No. 101 represent the condition recommended for the brazing material employed in this test.

TABLE 1

| Sample No. | Substrate Diamond | | Insulating Plate Thickness [μm] | Brazing Material Thickness [μm] | Bonding Condition |
|---|---|---|---|---|---|
| | Average Particle Size [μm] | Content [Volume %] | | | |
| 1 | 20 | 60 | 200 | 50 | 830° C. × 20 minutes |
| 101 | 20 | 60 | 200 | 50 | 800° C. × 5 minutes |

A component in a region interposed between the substrate and the insulating plate in each of the heat radiation members of made samples Nos. 1 and 101 was analyzed. Table 2 shows results.

Component analysis of the layer interposed between the substrate and the insulating plate described above was conducted as below.

A cross-section of the heat radiation member of each sample was taken by cutting the heat radiation member along a plane in the thickness direction of the substrate (which was substantially identical to the direction of stack of the substrate and the insulating plate). The cross-section was observed with the SEM. A region (observed region) interposed between the substrate and the insulating plate was extracted from an SEM image of the cross-section. The observed region lies in a form of a belt along the creepage direction of the surface of the substrate or the surface of the insulating plate (see bonding layer 3 in FIG. 1A). The observed region in the form of the belt corresponds to the bonding layer between the substrate and the insulating plate.

In the observed region in the form of the belt, a plurality of points different in position in the creepage direction were set as measurement points. Component analysis at the central position in the thickness direction was conducted at each measurement point. Component analysis was conducted at ten different measurement points.

In this test, Ag, Cu, Ti, Sn, carbon (C), nitrogen (N), Al, and oxygen (O) were detected at each measurement point. At each measurement point, a content (atomic %) of each element was examined, with a total content of the detected elements being defined as 100 atomic %. Carbon (C) is considered as being derived from diamond in the substrate. Nitrogen (N) and Al are considered as being derived from AlN in the insulating plate.

A result of analysis at the ten measurement points was used and the contents of each element were averaged. The average value of the contents of each element was defined as the content of each element in the constituent material in the observed region. For example, the content (atomic %) of Ti was examined at the ten measurement points and the contents (atomic %) of Ti were averaged. This average value was defined as the content (atomic %) of Ti in the bonding layer (observed region).

Table 2 shows only the content (atomic %) of Ag, Cu, and Ti, and does not show the content of other elements. A ratio of the content (atomic %) of Ti with the total of the content (atomic %) of Ag, the content (atomic %) of Cu, and the content (atomic %) of Ti being defined as 100 atomic % was calculated based on the content (atomic %) of Ag, Cu, and Ti. The ratio of the content of Ti (Ti/(Ag+Cu+Ti)) was defined as the concentration (atomic %) of Ti in the bonding layer and is shown in Table 2.

An EDX apparatus attached to the SEM was used for component analysis described above. For example, a known silicon drift detector (SDD) can be employed as the EDX apparatus.

Thermal conductivity (W/(m·K)) of the heat radiation members of samples Nos. 1 and 101 was measured. Table 2 shows a measurement result.

The thermal conductivity (W/m·K) of the heat radiation member described above was measured by the flash method with the use of a commercially available measurement apparatus (NETZSCH LFA447). Measurement conditions were in conformity with ASTM E1461-13 "Standard Test Method for Thermal Diffusivity by the Flash Method."

A thickness (μm) of the bonding layer of each of the heat radiation members of samples Nos. 1 and 101 was measured. Table 2 shows a measurement result.

The thickness of the bonding layer described above was measured by using the SEM image of the cross-section used for component analysis of the bonding layer described above. A region interposed between the substrate and the insulating plate, that is, the observed region in the form of the belt, was extracted from the SEM image of the cross-section as described above. A plurality of points different in position in the creepage direction of the surface of the substrate or the surface of the insulating plate were set as the measurement points as described above. A distance along the thickness direction of the substrate between the surface of the substrate and the surface of the insulating plate was found at each measurement point. The distances at the ten different measurement points were found. The distances at the ten measurement points were averaged. This average value was defined as the thickness (μm) of the bonding layer and is shown in Table 2.

constituent elements (Ag, Cu, and Ti) of the brazing material used in the manufacturing process. Therefore, increase in thermal resistance resulting from interposition of a nickel plated layer could be suppressed. The single bonding layer was confirmed in the observed image obtained by observation of the cross-section of the heat radiation member described above with the SEM.

(c) The bonding layer had a small thickness. The bonding layer had a thickness not larger than 10 or furthermore, not larger than 5 μm, or in particular not larger than 2 μm. Therefore, increase in thermal resistance resulting from the bonding layer itself could be suppressed.

The reason why the heat radiation member of sample No. 1 had high thermal conductivity in this test may further be as below.

(c) The constituent metal of the metallic phase of the composite material was pure silver.

(d) The bonding layer was composed of the alloy containing the main metal element (Ag) that makes up the metallic phase of the substrate. Such a bonding layer is manufactured with the brazing material composed of the alloy (the silver-based alloy) based on the metal element for bonding the substrate and the insulating plate to each other as in the present test. The constituent element of the brazing material readily diffused into the metallic phase in the substrate during bonding. Therefore, the bonding layer was readily made smaller in thickness.

(e) The bonding layer was composed of the alloy containing Ti. Such a bonding layer was manufactured with the brazing material composed of the alloy containing Ti for bonding the substrate and the insulating plate to each other as in the present test. Ti in the brazing material reacted with carbon that made up diamond in the substrate and nitrogen that made up AlN in the insulating plate during bonding. Consequently, the brazing material satisfactorily wetted the substrate and the insulating plate to allow intimate contact between the substrate and the insulating plate.

(f) In particular, in this test, the bonding condition was set such that the heating temperature was higher than the heating temperature under the recommended condition and the heating time period was longer than the heating time period under the recommended condition. There-

TABLE 2

| Sample No. | Bonding layer | | | | Bonding Layer Thickness [μm] | Thermal Conductivity [W/m · K] |
|---|---|---|---|---|---|---|
| | Ti Content [Atomic %] | Ag Content [Atomic %] | Cu Content [Atomic %] | Ti Concentration Ti/(Ag + Cu + Ti) [Atomic %] | | |
| 1 | 36.71 | 10.96 | 2.98 | 72.48 | 1.4 | 435 |
| 101 | 16.07 | 25.64 | 8.17 | 32.21 | 15.31 | 342 |

As shown in Table 1, the heat radiation member of sample No. 1 had high thermal conductivity not lower than 400 W/m·K. The thermal conductivity here was higher, that is, not lower than 430 W/m·K. The reason why the thermal conductivity was high may be as below.

(a) The composite material contained diamond and the insulating plate was composed of AlN. In other words, main constituent materials of the heat radiation member had high thermal conductivity.

(b) A single bonding layer was provided. The bonding layer was mainly composed of an alloy containing fore, it is considered that diffusion of the constituent element of the brazing material described above into the metallic phase and reaction between Ti and the constituent element of diamond or AlN could be accelerated so that the substrate and the insulating plate were more reliably brought in intimate contact with each other and the bonding layer could be made smaller in thickness.

(g) In particular, the concentration of Ti in the bonding layer satisfied a concentration not lower than 40 atomic % and not higher than 95 atomic % with the total amount of Ag, Cu, and Ti being defined as 100 atomic %. It is considered that, by containing Ti in the bonding layer within the range described above, reaction between Ti described above and the constituent element of diamond or AlN appropriately occurred and the substrate and the insulating plate could satisfactorily be brought in intimate contact with each other in the manufacturing process. In particular, in this test, the concentration of Ti was as high as at least 60 atomic %. In other words, the bonding layer was made higher in concentration of Ti. This higher concentration of Ti may have been brought about by two factors below. One factor is that, in the manufacturing process, reaction between Ti described above and the constituent element of diamond or AlN satisfactorily occurred and Ti readily remained in the bonding layer. The second factor may be that Ag or Cu in the brazing material readily diffused into the metallic phase in the substrate in the manufacturing process.

The heat radiation member of sample No. 101 had thermal conductivity around 340 W/m·K, which was lower than the thermal conductivity of the heat radiation member of sample No. 1. In the heat radiation member of sample No. 101, the bonding layer had a thickness exceeding 15 which was larger than the thickness of the bonding layer of the heat radiation member of sample No. 1. Furthermore, in the heat radiation member of sample No. 101, the concentration of Ti in the bonding layer was around 32 atomic % with the total amount of Ag, Cu, and Ti being defined as 100 atomic %, and this concentration was lower than in the bonding layer of the heat radiation member of sample No. 1.

One of reasons why results were different between sample No. 1 and sample No. 101 in spite of use of the same substrate and insulating plate and the same brazing material may reside in difference in bonding condition. The bonding condition for sample No. 101 was lower in heating temperature and shorter in heating time period than the bonding condition for sample No. 1. Therefore, Ag or Cu in the brazing material may not have sufficiently diffused into the adjacent metallic phase in the substrate and the bonding layer may have tended to be large in thickness. This is supported by the fact that the thickness of the bonding layer of sample No. 101 was at least ten times as large as the thickness of the bonding layer of sample No. 1 and by the fact that the concentration of Ti described above in the bonding layer of sample No. 101 was very low, that is, lower than ½ the concentration of Ti in the bonding layer of sample No. 1. The low concentration of Ti is nothing but Ag and Cu larger in amount with respect to the total amount of Ag, Cu, and Ti. A relatively high content of Ag and Cu in the bonding layer can be concluded as supporting insufficient diffusion of Ag and Cu into the brazing material during bonding.

From the foregoing, a composite member in which the substrate composed of the composite material containing diamond and the insulating plate composed of AlN were bonded to each other by the single bonding layer was shown to be excellent in electrical insulation and to be high in thermal conductivity as high as 400 W/m·K or higher. Such a heat radiation member can suitably be used as a heat radiation member for a semiconductor element. This heat radiation member was shown to be manufactured by bonding under a specific bonding condition by using the substrate, the insulating plate, and the brazing material.

The present invention is not limited to these illustrations but defined by the terms of the claims, and is intended to include any modifications within the scope and meaning equivalent to the terms of the claims.

For example, in the first test example, a composition of the metallic phase in the composite material, a particle size and a content of diamond, a thickness of the substrate, a composition and a thickness of the brazing material, and a bonding condition can be modified as appropriate.

REFERENCE SIGNS LIST

1 heat radiation member; 2 substrate; 10 composite material; 20 diamond; 25 metallic phase; 21 coated particle; 22 core particle; 23 coating layer; 2f surface; 3 bonding layer; 4 insulating plate; 4f surface; 60 stack; 61 brazing material; 65 mold; 66 protective plate; 67 weight

The invention claimed is:
1. A heat radiation member for a semiconductor element comprising:
   a substrate composed of a composite material containing diamond and a metallic phase;
   an insulating plate provided on a surface of the substrate and composed of aluminum nitride; and
   a single bonding layer formed on the surface of the substrate, interposed between the substrate and the insulating plate,
   wherein a constituent metal of the metallic phase is pure silver or a silver-based alloy,
   the bonding layer is composed of an alloy containing Ag, Cu, and Ti, and
   a concentration of the Ti in the bonding layer is not lower than 40 atomic % and not higher than 95 atomic % with a total amount of Ag, Cu, and Ti being defined as 100 atomic %.
2. The heat radiation member according to claim 1, wherein
   the bonding layer is composed of an alloy containing Ti and a main metal element that makes up the metallic phase.
3. The heat radiation member according to claim 1, wherein the bonding layer comprise a brazing material composed of a silver-based alloy based on the eutectic alloy of Ag and Cu and containing Ti.
4. The heat radiation member according to claim 3, the concentration of Ti is not lower than 0.5 atomic % and not higher than 3.0 atomic % with the total amount of Ag, Cu, and Ti being defined as 100 atomic %.

* * * * *